US010872926B2

(12) United States Patent
Ge

(10) Patent No.: US 10,872,926 B2
(45) Date of Patent: Dec. 22, 2020

(54) VECTOR-MATRIX MULTIPLICATION ACCELERATOR IMPLEMENTED USING FOLDED RESISTIVE CROSSBARS

(71) Applicant: TETRAMEM INC., Newark, CA (US)

(72) Inventor: Ning Ge, Newark, CA (US)

(*) Notice: Subject to any disclaimer, the term of this patent is extended or adjusted under 35 U.S.C. 154(b) by 0 days.

(21) Appl. No.: 16/392,845

(22) Filed: Apr. 24, 2019

(65) Prior Publication Data

US 2020/0343304 A1   Oct. 29, 2020

(51) Int. Cl.
*H01L 27/24* (2006.01)
*G11C 13/00* (2006.01)
*G06F 17/16* (2006.01)

(52) U.S. Cl.
CPC ........ *H01L 27/2463* (2013.01); *G11C 13/003* (2013.01); *G06F 17/16* (2013.01)

(58) Field of Classification Search
CPC .... H01L 27/2463; G11C 13/003; G06F 17/16
USPC .......................................................... 257/4
See application file for complete search history.

(56) References Cited

U.S. PATENT DOCUMENTS

2019/0050719 A1* 2/2019 Cantin ................. G06N 3/0635

* cited by examiner

*Primary Examiner* — Tong-Ho Kim

(57) ABSTRACT

Technologies relating to folded crossbar array circuits and methods for reducing pitch match issues within folded crossbar array circuits and increasing the scalability of folded crossbar array circuits are disclosed. An example crossbar array circuit includes: a first folded column circuit folded as at least two portions; a first ADC; a first plurality of DACs; and a first plurality of access controls, wherein the first folded column circuit connected to the first ADC, the first plurality of DACs, and the first plurality of access controls. In some implementations, the three portions comprises a first column of crossbar devices, a second column of crossbar devices, and a third column of crossbar devices, and wherein the first column of crossbar devices, the second column of crossbar devices, and the third column of crossbar devices are configured to be controlled by the first plurality of access controls.

10 Claims, 4 Drawing Sheets

VECTOR-MATRIX MULTIPLICATION ACCELERATOR IMPLEMENTED USING FOLDED RESISTIVE CROSSBARS

TECHNICAL FIELD

The present disclosure generally related to crossbar array circuits with Resistive Random-Access Memory (RRAM) and more specifically to folded crossbar array circuits and reducing pitch match issues within and increasing scalability of folded crossbar array circuits.

BACKGROUND

Traditionally, a crossbar array circuit may include horizontal metal wire rows and vertical metal wire columns (or other electrodes) intersecting with each other, with crossbar devices formed at the intersecting points. A crossbar array may be used in non-volatile solid-state memory, signal processing, control systems, high-speed image processing systems, neural network systems, and so on.

A RRAM is a two-terminal passive device capable of changing resistance responsive to sufficient electrical stimulations, which have attracted significant attention for high-performance non-volatile memory applications. The resistance of a RRAM may be electrically switched between two states: a High-Resistance State (HRS) and a Low-Resistance State (LRS). The switching event from a FIRS to a LRS is often referred to as a "Set" or "On" switch; the switching systems from a LRS to a FIRS is often referred to as a "Reset" or "Off" switching process.

A Digital-to-Analog Converter (DAC) converts a digital signal into an analog signal; an Analog to Digital Convertor (ADC) converts an analog signal into a digital signal. ADCs and DACs are used as the interfaces between crossbars and digital circuits.

SUMMARY

Technologies relating to folded crossbar array circuits and methods for reducing pitch match issues within folded crossbar array circuits and increasing the scalability of folded crossbar array circuits are disclosed.

A crossbar array circuit, in some implementations, includes: a first folded column circuit folded as at least two portions; a first ADC; a first plurality of DACs; and a first plurality of access controls, wherein the first folded column circuit connected to the first ADC, the first plurality of DACs, and the first plurality of access controls.

In some implementations, a folding style of the first folded column circuit includes an accordion fold.

In some implementations, the two portions include a first column of crossbar devices, a second column of crossbar devices, and a third column of crossbar devices, and wherein the first column of crossbar devices, the second column of crossbar devices, and the third column of crossbar devices are configured to be controlled by the first plurality of access controls.

In some implementations, the first column of crossbar devices includes a first crossbar device, the second column of crossbar devices includes a second crossbar device, and the third column of crossbar devices includes a third crossbar device, and wherein the first crossbar device, the second crossbar device, or the third crossbar device includes an access transistor configured to be controlled by the first plurality of access controls.

In some implementations, the first crossbar device, the second crossbar device, or the third crossbar device includes an RRAM device.

In some implementations, a number of folds is determined in accordance with a ratio of a line width of the first column of crossbar devices to a width of the first ADC.

The crossbar array circuit, in some implementations, further includes: a plurality of folded column circuits including the first folded column circuit; and a plurality of ADCs including the first ADC, wherein the plurality of folded column circuits connected to the plurality of ADCs, the first plurality of DACs, and the first plurality of access controls.

In some implementations, a ratio of a number of total columns in the crossbar array circuit to a number of total ADCs in the crossbar array circuit is the number of folds.

The crossbar array circuit, in some implementations, further includes a ramping circuit connected to the first plurality of DACs.

In some implementations, the ramping circuit includes a ramping signal generator and a clock.

BRIEF DESCRIPTION OF THE DRAWINGS

The implementations disclosed herein are illustrated by way of example, and not by way of limitation, in the figures of the accompanying drawings. Like reference numerals refer to corresponding parts throughout the drawings.

DETAILED DESCRIPTION

Technologies relating to folded crossbar array circuits and methods for reducing pitch match issues within folded crossbar array circuits and increasing the scalability of folded crossbar array circuits are disclosed. The technologies described in the present disclosure may provide the following technical advantages.

First, the folded crossbar arrays described in the present disclosure solve the pitch match issues. A pitch refers to the distance between two adjacent crossbar devices in an array. A pitch mismatch occurs within a crossbar array circuit when an interface device (e.g., a DAC or an ADC) and a crossbar device mismatch each other in a row or a column, because they have different sizes (or widths). A folded crossbar array provides a layout of interface devices and crossbar devices to addresses pitch matches between these devices.

Second, due to the reduced column-wise (or row-wise) correlation, as described in the present disclosure, the impact of parasitic may also be reduced.

Third, using the designs described in the present disclosure, a folded crossbar array may store more weight matrix than a conventional crossbar array, whose size is limited by its dimensions. Also, it is more flexible to store weight matrix with moderate modification (e.g., adjusting the input vector). Therefore, the folded crossbar array circuits described in the present disclosure increase the flexibility and scalability of their applications. For example, a folded crossbar array circuit as disclosed may be used for larger scale vector-matrix multiplications.

Figure 1:
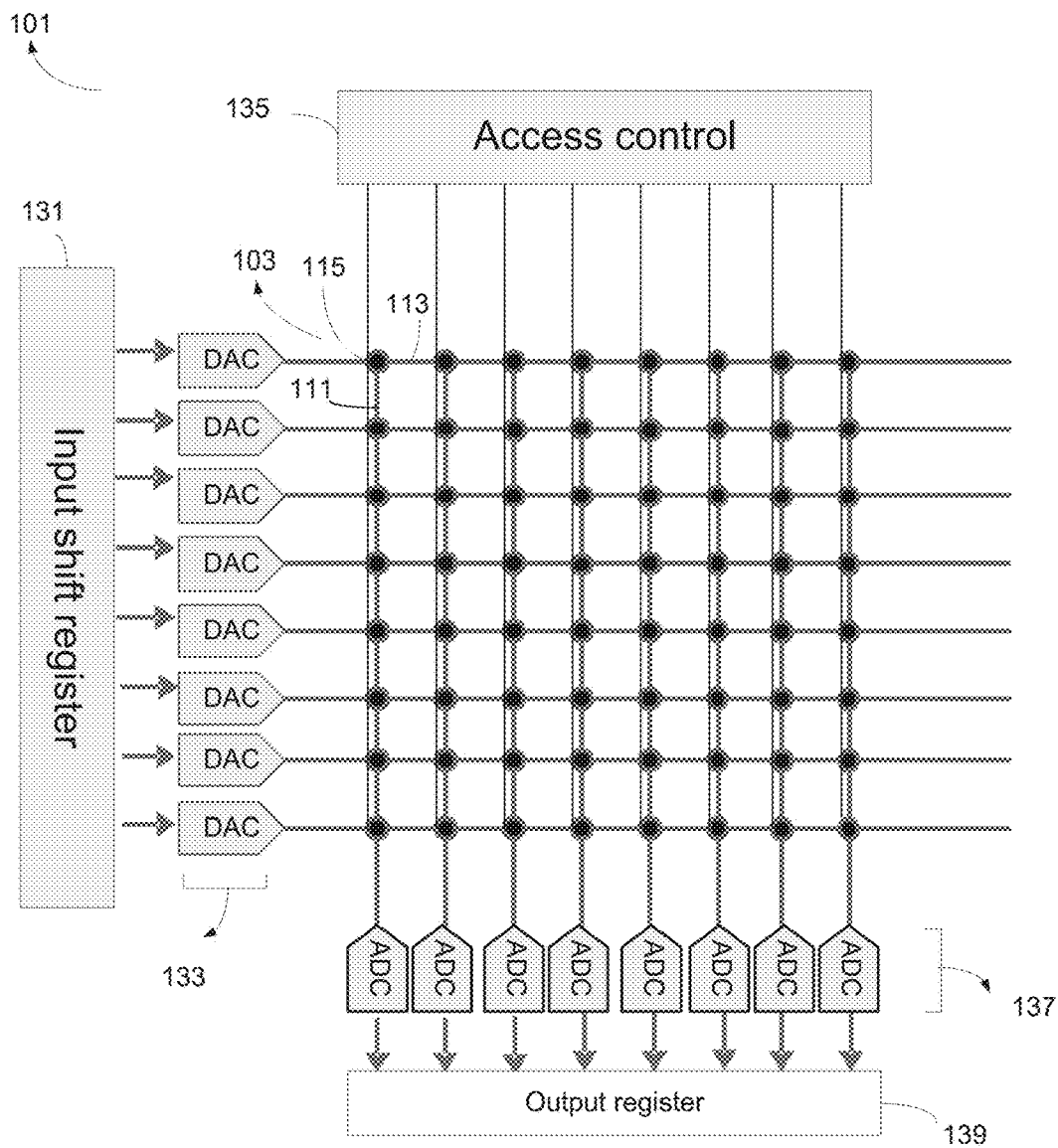
FIG. 1 is a block diagram illustrating an example crossbar array circuit in accordance with some implementations of the present disclosure.

FIG. 1 is a block diagram 100 illustrating an example crossbar array circuit 101 in accordance with some implementations of the present disclosure. As shown in FIG. 1, the crossbar array circuit 101 includes a crossbar array 103, which includes a plurality of column wires (e.g., the column wire 111), a plurality of row wires (e.g., the row wire 113), and a plurality of crossbar devices (e.g., the crossbar device 115) connected between the plurality of column wires and the plurality of row wires. The crossbar array circuit 101 may further include an input (e.g., an input shift register 131); a plurality of DACs 133 connected between the input shift register 131 and the plurality of row wires; an access control 135 (or a plurality of access controls) connected to the plurality of crossbar devices; a plurality of ADCs 137 connected to the plurality of column wires; and an output (e.g., an output register 139) connected to the plurality of ADCs 137.

Several technical problems may arise when the example crossbar array circuit 101 is used to conduct vector-matrix multiplication.

First, as shown in FIG. 1, the plurality of ADCs, the plurality of DACs, or both, may need to be pitch matched to the crossbar array 103. This pitch match is usually quite difficult or sometimes impossible with the power/speed constraints. If the sizes of ADCs or DACs are large enough to have the suitable power or speed to process the entire crossbar array 103, it may not pitch match with the size of crossbar devices. Some circuit designs are therefore unsuitable for implementations due to the pitch match limitation.

Second, when conducting computing, the crossbar array 103's parasitic effect (e.g., wire resistance, device nonlinearity, temperature) may cause error, which is strongly coupled to the stored weight pattern and input data pattern. In crossbar array 103, the parasitic effect is a strong coupling result between inter-column effect and intra-column effect. This issue results in inaccuracy especially in large scale crossbars. The parasitic may accumulate (particularly, in devices located near at far ends of a circuit) in a larger scale crossbar array and degrade computation results. Reducing or eliminating inter-column parasitic effect reduces the total impact of parasitic, rendering it easier to compensate.

Third, the crossbar array circuit 101 may store only weight matrix whose dimensions are equal to or smaller than the dimensions of the array 103. For instance, a 128*128 weight matrix can be implemented by 128 ADCs and 128 DACs with a 128*128 crossbar array. A 128*128 crossbar array, however, could not store a 256*64 weight matrix, even the 128*128 crossbar has a sufficient total number of devices. It would more efficient if a m×n crossbar can store any p×q weight matrix with $p \cdot q < m \cdot n$, instead of ($p<m$ && $q<n$)

Figure 2:
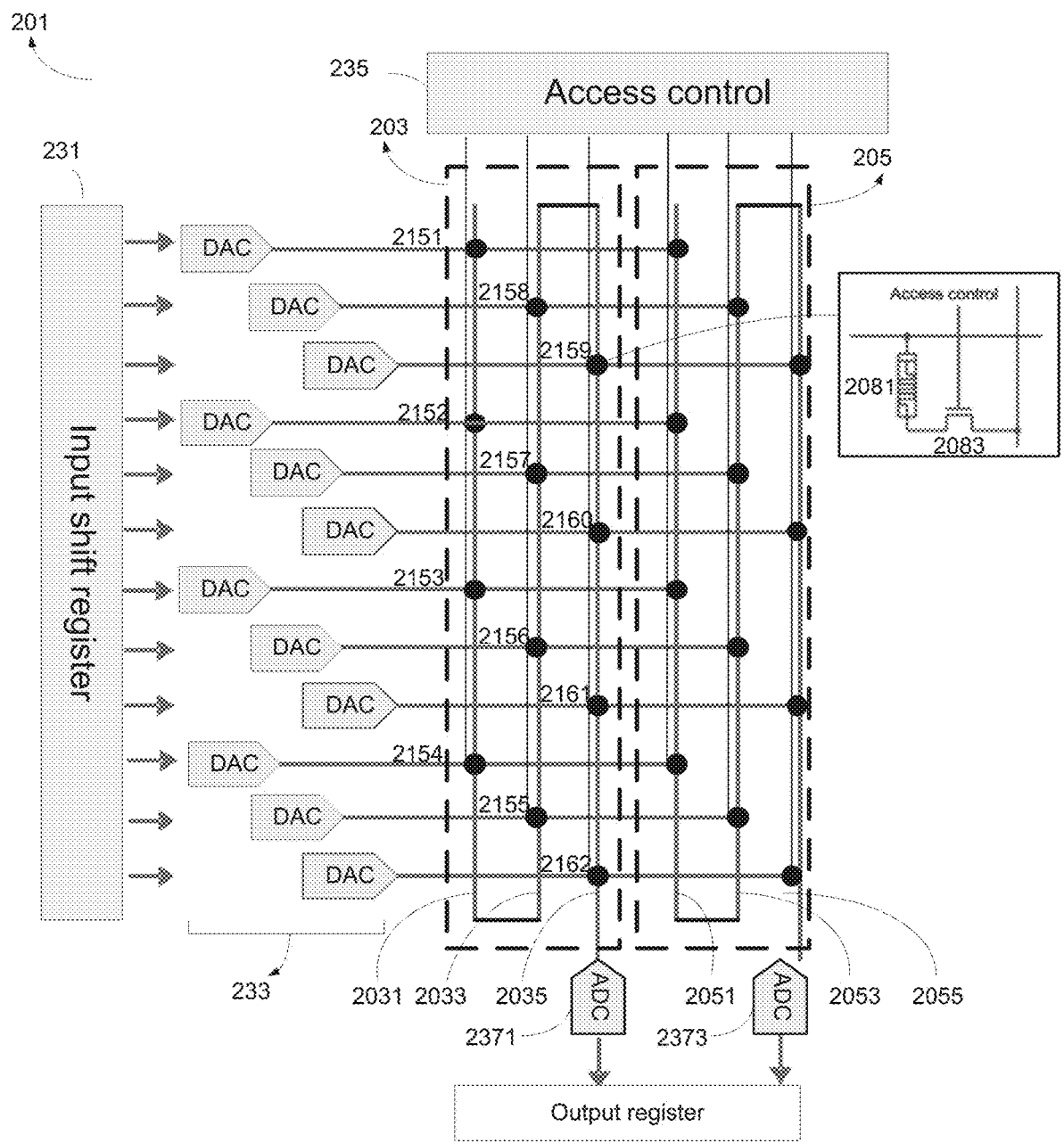
FIG. 2 is a block diagram illustrating an example 3-fold example crossbar array circuit in accordance with some implementations of the present disclosure.

FIG. 2 is a block diagram illustrating an example 3-fold example crossbar array circuit 201 in accordance with some implementations of the present disclosure.

As shown in FIG. 2, the crossbar array circuit 201 includes (1) a first folded column circuit 203 folded as three portions: the first column of crossbar devices 2031, a second column of crossbar devices 2033, and a third column of crossbar devices 2035; (2) a second folded column circuit 205 folded as three portions: the fourth column of crossbar devices 2051, a fifth column of crossbar devices 2053, and a sixth column of crossbar devices 2055; (3) a first ADC 2371 connected to the third column of crossbar devices 2035; (4) a second ADC 2373 connected to the sixth column of crossbar devices 2055; (5) a first plurality of DACs 233 connected to each crossbar device (e.g., crossbar device 2151) in the crossbar array circuit 201; and (6) a first plurality of access controls 235 connected to each column of the crossbar devices in the crossbar array circuit 201 (e.g., from the first column of crossbar devices 2031 to the sixth column of crossbar devices 2055).

Since only the first ADC 2371 is connected to the first folded column circuit 203 (which include three columns), it saves approximately 75% of the ADC layout space otherwise required. The pitch match issue may therefore be solved, and a more flexible layout design may be achieved: one can choose an ADC with a larger size (and thus have greater power or speed) compatible with a larger scale crossbar array. Also, the parasitic impacts are also reduced, due to the reduced intra-column or column-wise correlation. It should be noted that the first plurality of access controls 235 are still connected to each column or each row of the crossbar array 103, each of which is connected to the gate of the access transistor.

In a m×n crossbar, since the first DAC is connected to columns i, where i=1, 4, 7, . . . and i<n, the second DAC is connected to column j, where j=2, 5, 8, . . . and j<n, the third DAC is connected to only column k, k=3, 6, 9, . . . and k<n, the DACs may be spatially arranged in a staggered fashion instead of within a single column. Thus, in a 3-fold crossbar, each DAC can have twice more space in height, providing greater design flexibility. The folding style of the first folded column circuit, in some implementations, includes an accordion fold as shown in FIG. 2.

In some implementations, the first column of crossbar devices 2031 includes crossbar device 2151-2154; the second column of crossbar devices includes crossbar device 2155-2158; and the third column of crossbar devices includes crossbar device 2159-2162. The crossbar device 2154 and the crossbar device 2155 are connected; the crossbar device 2158 and the crossbar device 2159 are connected; and the crossbar device 2162 and the first ADC 2371 are connected. Each of the crossbar devices 2151-2162 is connected to the first plurality of access controls 235.

The first column of crossbar devices 2031, the second column of crossbar devices 2033, and the third column of crossbar devices 2035 are, in some implementations, configured to be controlled by the first plurality of access controls 235.

Each of the crossbar devices 2151-2162, in some implementations, includes an access transistor 2013 and an RRAM device 2081. Each of the crossbar devices 2151-2162 may be controlled by the first plurality of access controls 235 via access transistors in each crossbar device.

The example 3-fold crossbar array circuit 201 is only one of the example implementations. In some other implementations, the crossbar array circuit 201 includes a plurality of folded column circuits (which may include the first folded column circuit 203); and a plurality of ADCs (which may include the first ADC 2371). The plurality of folded column circuits may be connected to the plurality of ADCs, the first plurality of DACs 233, and the first plurality of access controls 235.

The crossbar array circuit 201 has, in some implementations, multiple folds in each of folded column circuits. More specifically, the crossbar array circuit 201 may include more than three folds.

The total number of folds is, in some implementations, determined in accordance with a ratio of a line width of the column of the crossbar devices (e.g., the line width of the first column of the crossbar devices 2031) to a width of an ADC (e.g., the width of the first ADC 2371). The pitch match issue may be therefore resolved. In some implementations, the total number of folds equals to the ratio of the total number of columns in a crossbar array circuit to the total number of ADCs in the crossbar array circuit.

Figure 3:
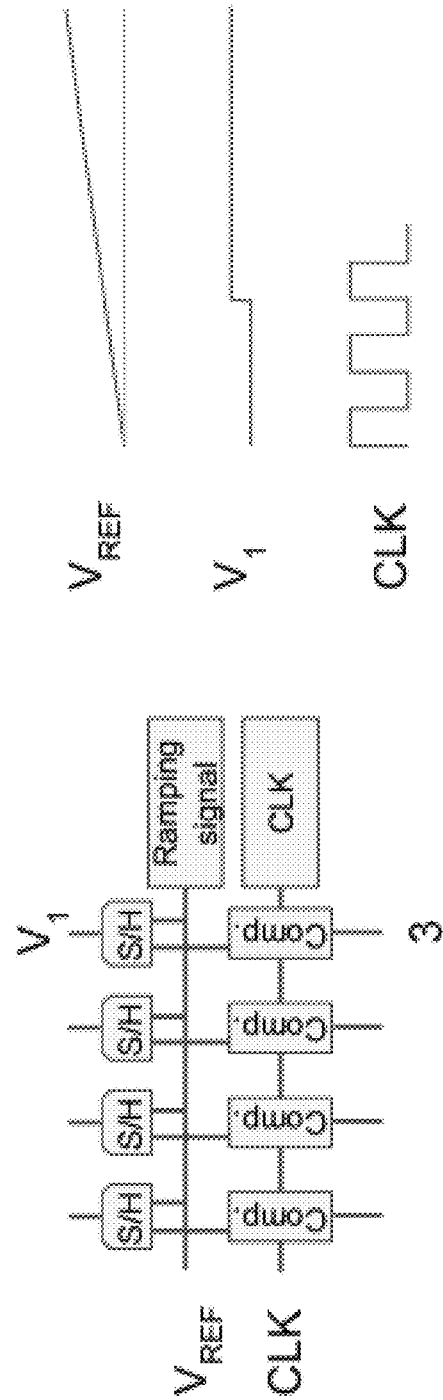
FIG. 3 is a block diagram illustrating an example ramping circuit in accordance with some implementations of the present disclosure.

FIG. 3 is a block diagram 300 illustrating an example ramping circuit in accordance with some implementations of the present disclosure. The ramping circuit may use (1) one ramping signal (generated by a ramping signal generator) as a global reference signal, and (2) a global clock to synchronize all input channels, for instance, a 4-channel ramping DAC design and timing diagram as shown in FIG. 3. The $V_{ref}$ ramping may between 0 to 1V, and each channel may have 8 bits (0 to 255). A conventional ramping DAC may have some drawbacks. For example, the channel number (usually under 64) and speed are limited due to transmission line issues. The two global wires for $V_{ref}$ and CLK could not be too long, otherwise the devices on further end may receive degraded signals and thus may not function as expected.

Figure 4:
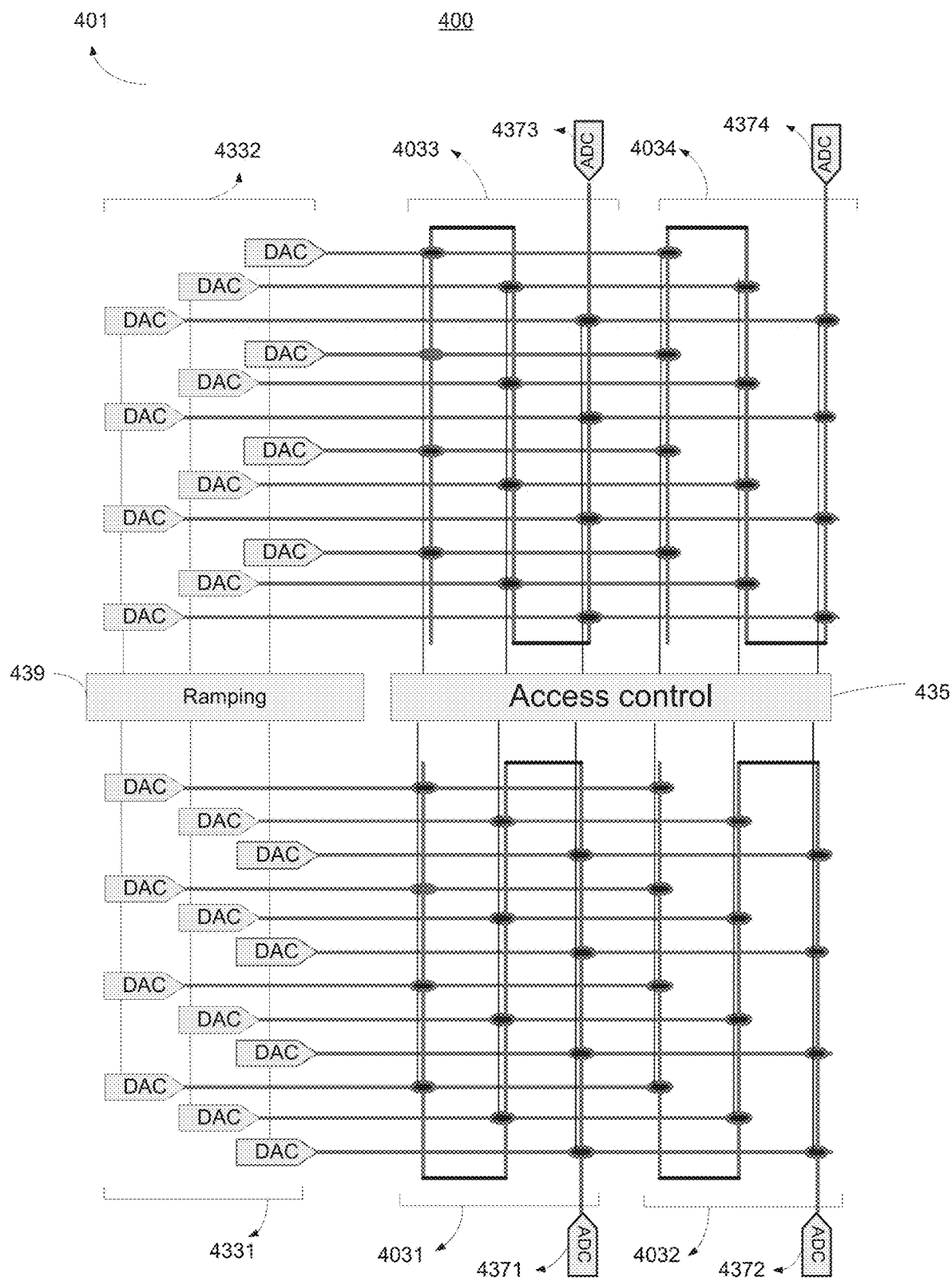
FIG. 4 is a block diagram illustrating a crossbar array circuit with a ramping circuit in accordance with some implementations of the present disclosure.

FIG. 4 is a block diagram illustrating a crossbar array circuit 401 with a ramping circuit in accordance with some implementations of the present disclosure. As shown in FIG. 4, the crossbar array circuit 401 includes (1) a first folded column circuit 4031; (2) a second folded column circuit 4032; (3) a third folded column circuit 4033; (4) a fourth folded column circuit 4034; (5) a first ADC 4371 connected to the first folded column circuit 4031; (6) a second ADC 4372 connected to the second folded column circuit 4032; (7) a third ADC 4373 connected to the third folded column circuit 4033; (8) a fourth ADC 4374 connected to the fourth folded column circuit 4074; (9) a first plurality of DACs 4331 connected to each crossbar devices in the first folded column circuit 4031 and the second folded column circuit 4032; (10) a second plurality of DACs 4332 connected to each crossbar devices in the third folded column circuit 4033 and the fourth folded column circuit 4034; (11) a first plurality of access controls 435 connected to each crossbar devices in the first to fourth folded column circuits; and (12) a ramping circuit 439 connected to the first plurality of DACs 4331 and the second plurality of DACs 4332.

The ramping circuit 439, in some implementations, includes a signal generator and a clock. Because the global wires are also folded, incorporating the ramping circuit 439 into a folded crossbar array may reduce transmission length, allowing more consistent signal to be transmitted to each input channel.

This design may allow more channels, faster operation, and lower power consumption. Furthermore, the crossbar array may support a larger input size. The crossbar array is more flexible to store weight matrix. Take the crossbar array circuit shown in FIG. 4 for example, the bottom array circuit (the first folded column circuit 4031 and the second folded column circuit 4032) is capable of performing Vector Matrix Multiplication (VMM) having a 1×12 input vector and a 12×2 matrix, as well as VMMs having a 1×4 input vector and a 4×6 matrix.

During the first iteration, column 1 and column 4 may be enabled; during the second iteration, column 2 and column 5 may be enabled; during the third iteration, column 3 and column 6 may be enabled. More choices are made available with the current circuit design. And, as explained above, ADCs and DACs are no longer required to be pitch matched with the crossbar array.

Plural instances may be provided for components, operations or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the implementation(s). In general, structures and functionality presented as separate components in the example configurations may be implemented as a combined structure or component. Similarly, structures and functionality presented as a single component may be implemented as separate components. These and other variations, modifications, additions, and improvements fall within the scope of the implementation(s).

It will also be understood that, although the terms "first," "second," etc. may be used herein to describe various elements, these elements should not be limited by these terms. These terms are only used to distinguish one element from another. For example, a first column could be termed a second column, and, similarly, a second column could be termed the first column, without changing the meaning of the description, so long as all occurrences of the "first column" are renamed consistently and all occurrences of the "second column" are renamed consistently. The first column and the second are columns both column s, but they are not the same column.

The terminology used herein is for the purpose of describing particular implementations only and is not intended to be limiting of the claims. As used in the description of the implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

The foregoing description included example systems, methods, techniques, instruction sequences, and computing machine program products that embody illustrative implementations. For purposes of explanation, numerous specific details were set forth in order to provide an understanding of various implementations of the inventive subject matter. It will be evident, however, to those skilled in the art that implementations of the inventive subject matter may be practiced without these specific details. In general, well-known instruction instances, protocols, structures, and techniques have not been shown in detail.

The foregoing description, for purpose of explanation, has been described with reference to specific implementations. However, the illustrative discussions above are not intended to be exhaustive or to limit the implementations to the precise forms disclosed. Many modifications and variations are possible in view of the above teachings. The implementations were chosen and described in order to best explain the principles and their practical applications, to thereby enable others skilled in the art to best utilize the implementations and various implementations with various modifications as are suited to the particular use contemplated.

What is claimed is:

1. A crossbar array circuit comprising:
   a first folded column circuit folded as at least two portions;
   a first analog-to-digital converter (ADC);
   a first plurality of digital-to-analog converters (DACs); and
   a first plurality of access controls, wherein
      the first folded column circuit connected to the first ADC, the first plurality of DACs, and the first plurality of access controls.

2. The crossbar array circuit as claimed in claim 1, wherein a folding style of the first folded column circuit comprises an accordion fold.

3. The crossbar array circuit as claimed in claim 1, wherein the two portions comprises a first column of crossbar devices, a second column of crossbar devices, and a third column of crossbar devices, and wherein the first column of crossbar devices, the second column of crossbar devices, and the third column of crossbar devices are configured to be controlled by the first plurality of access controls.

4. The crossbar array circuit as claimed in claim 3, wherein the first column of crossbar devices comprises a first crossbar device, the second column of crossbar devices comprises a second crossbar device, and the third column of crossbar devices comprises a third crossbar device, and wherein the first crossbar device, the second crossbar device, or the third crossbar device comprises an access transistor configured to be controlled by the first plurality of access controls.

5. The crossbar array circuit as claimed in claim 4, wherein the first crossbar device, the second crossbar device, or the third crossbar device comprises an RRAM device.

6. The crossbar array circuit as claimed in claim 4, wherein a number of folds is determined in accordance with a ratio of a line width of the first column of crossbar devices to a width of the first ADC.

7. The crossbar array circuit as claimed in claim 6, further comprises:
   a plurality of folded column circuits comprising the first folded column circuit; and
   a plurality of ADCs comprising the first ADC, wherein the plurality of folded column circuits connected to the plurality of ADCs, the first plurality of DACs, and the first plurality of access controls.

8. The crossbar array circuit as claimed in claim 7, wherein a ratio of a number of total columns in the crossbar array circuit to a number of total ADCs in the crossbar array circuit is the number of folds.

9. The crossbar array circuit as claimed in claim 1 further comprises a ramping circuit connected to the first plurality of DACs.

10. The crossbar array circuit as claimed in claim 9, wherein the ramping circuit comprises a ramping signal generator and a clock.

* * * * *